United States Patent [19]
Xie

[11] Patent Number: 5,880,524
[45] Date of Patent: Mar. 9, 1999

[54] HEAT PIPE LID FOR ELECTRONIC PACKAGES

[75] Inventor: Hong Xie, Phoenix, Ariz.

[73] Assignee: Intel Corporation, Santa Clara, Calif.

[21] Appl. No.: 851,152

[22] Filed: May 5, 1997

[51] Int. Cl.[6] .......................... H01L 23/347; H01L 25/04; H01L 23/46; H01L 23/42
[52] U.S. Cl. .................. 257/704; 257/714; 257/708; 257/710; 257/713; 257/717; 257/722
[58] Field of Search .................... 257/675, 704, 257/706–717, 796, 722; 361/704; 774/16.3; 29/827

[56] References Cited

U.S. PATENT DOCUMENTS

| | | | |
|---|---|---|---|
| 4,047,198 | 9/1977 | Sekhon et al. | 257/713 |
| 4,138,692 | 2/1979 | Mieke et al. | 257/714 |
| 4,145,708 | 3/1979 | Ferro et al. | 257/715 |
| 4,727,455 | 2/1988 | Neidig et al. | 361/385 |
| 4,878,108 | 10/1989 | Phelps, Jr. et al. | 257/796 |
| 4,880,052 | 11/1989 | Meyer, IV et al. | 165/104 |
| 4,912,548 | 3/1990 | Shanker et al. | 357/82 |
| 4,931,905 | 6/1990 | Cirrito et al. | 361/385 |
| 4,982,274 | 1/1991 | Murase et al. | 357/82 |
| 5,198,889 | 3/1993 | Hisano et al. | 257/717 |
| 5,239,200 | 8/1993 | Messina et al. | 257/713 |
| 5,253,702 | 10/1993 | Davidson et al. | 165/80.4 |
| 5,268,812 | 12/1993 | Conte | 361/698 |
| 5,283,715 | 2/1994 | Carlsten et al. | 361/702 |
| 5,291,064 | 3/1994 | Kurokawa | 257/709 |
| 5,329,993 | 7/1994 | Ettehadieh | 165/104 |
| 5,345,107 | 9/1994 | Daikoku et al. | 257/714 |
| 5,349,237 | 9/1994 | Sayka et al. | 257/715 |
| 5,365,400 | 11/1994 | Ashiwake et al. | 257/714 |
| 5,625,227 | 4/1997 | Estes et al. | 257/712 |
| 5,751,062 | 5/1998 | Daikoku et al. | 257/722 |

FOREIGN PATENT DOCUMENTS

| | | | |
|---|---|---|---|
| 59-213151 | 12/1984 | Japan | 257/714 |
| 60-143653 | 7/1985 | Japan | 257/704 |
| 61-18159 | 1/1986 | Japan | 257/714 |
| 63-192250 | 8/1988 | Japan | 257/714 |
| 1-24447 | 1/1989 | Japan | 257/714 |
| 3-22555 | 1/1991 | Japan | 257/714 |
| 3-215968 | 9/1991 | Japan | 257/712 |

*Primary Examiner*—Alexander Oscar Williams
*Attorney, Agent, or Firm*—Blakely, Sokoloff, Taylor & Zafman LLP

[57] ABSTRACT

An apparatus for spreading the heat generated by a semiconductor device. In one embodiment, a semiconductor device, such as a CPU, is mounted to a package substrate. A cover is attached to the package substrate creating a space therebetween for accommodating the semiconductor device. The package cover includes an external top surface and an external bottom surface and an inner cavity that comprises a heat pipe. The semiconductor device is thermally coupled to the bottom external surface of the cover.

38 Claims, 4 Drawing Sheets

HEAT PIPE LID FOR ELECTRONIC PACKAGES

FIELD OF THE INVENTION

The present invention relates generally to the packaging of integrated circuits, and more particularly to an arrangement for spreading heat generated by packaged integrated circuit devices.

BACKGROUND OF THE INVENTION

Within the integrated circuit industry there is a continuing effort to increase integrated circuit speed as well as device density. As a result of these efforts, there is a trend towards using flip chip technology when packaging complex high speed integrated circuits. Flip chip technology is also known as control collapse chip connection (C4) technology. In C4 technology, the integrated circuit die is flipped upside down. This is opposite to how integrated circuits are typically packaged today using wire bond technology. By flipping the integrated circuit die upside down, ball bonds may be used to provide direct electrical connections between the die and the package. Unlike wire bond technology, which only allows bonding along the periphery of the integrated circuit die, C4 technology allows connections to be placed anywhere on the integrated circuit die surface. This leads to a very low inductance power distribution to the integrated circuit which is another major advantage of C4 technology.

As integrated circuit technology has improved, substantially greater functionality has been incorporated into the devices. As integrated circuits have expanded in functionality, the size of the devices has diminished resulting in higher clocking frequencies and increased power consumption. As a consequence, the integrated circuit devices of today generate more heat while possessing smaller surface areas to dissipate the heat. Therefore, it is important to have a high rate of heat transfer from the integrated circuit package to maintain the junction temperatures of the integrated circuit within safe operating limits. Excessive junction temperatures may affect the performance of the circuit and cause permanent degradation of the chip.

Conventional packages typically use cooling plates to spread the heat generated by a semiconductor device and to transfer the heat to an external heat sink. Spreading the heat generated by the semiconductor device serves to reduce the heat flux at the package surface. By reducing the heat flux at the package surface, heat can be more efficiently removed by an external heat sink. The cooling plates or heat spreaders, as they are commonly called, are generally made of a thin metal plate, such as copper or aluminum. Although the use of cooling plates has proved sufficient in the past, they are unable to adequately reduce the heat flux at the surface of many present day packages that house high power generating components.

Therefore, what is needed is an apparatus for reducing the heat flux at the surface of high power semiconductor packages.

SUMMARY OF THE INVENTION

An apparatus for removing heat from a semiconductor device housed within a package is disclosed.

In one embodiment, a semiconductor device, such as a CPU, is mounted to a package substrate. A cover is attached to the package substrate creating a space therebetween for accommodating the semiconductor device. The package cover includes an external top surface and an external bottom surface and an inner cavity that comprises a heat pipe. The semiconductor device is thermally coupled to the bottom external surface of the cover.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus for removing heat from the surface of a semiconductor is described. In the following description, numerous specific details are set forth such as material types, dimensions, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention. This discussion will mainly be limited to those needs associated with removing heat from the backside of a flip chip that is housed within a pin grid array (PGA) package. It will be recognized, however, that such focus is for descriptive purposes only and that the apparatus and methods of the present invention are applicable to other types of electronic devices and other forms of packaging.

Figure 1A:
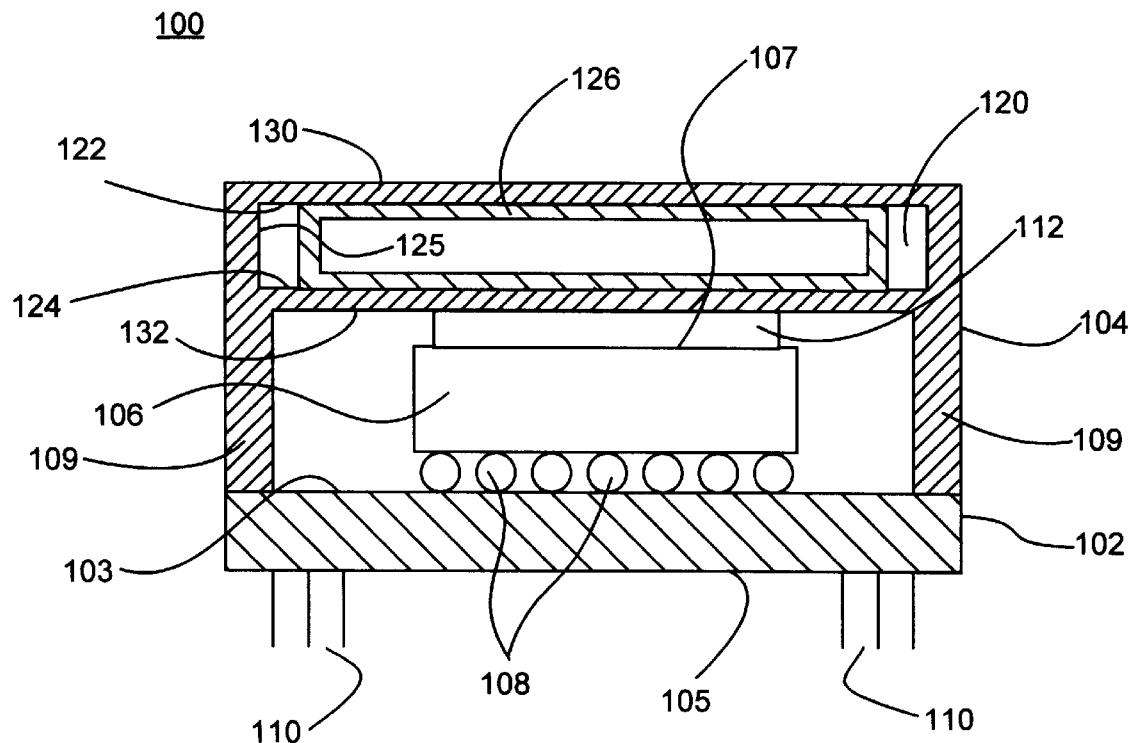
FIG. 1A illustrates a semiconductor package in accordance with one embodiment of the present invention.

FIG. 1A illustrates a cross-section view of a semiconductor package 100 in one embodiment of the present invention. Package 100 includes a substrate 102 having a semiconductor device 106 mounted on the top surface 103 of the substrate. In one embodiment, semiconductor device 106 is mechanically and electrically coupled to the top surface 103 of substrate 102 via a plurality of solder bump connections 108. Package 102 contains at least one wiring layer (not shown) that electrically connects device 106 to pins 110 located along the bottom surface 105 of substrate 102. In accordance with the present invention, a heat pipe cover/lid 104 is attached to substrate 102 to create a space therebetween for accommodating semiconductor device 106. Standoffs 109 serve to support cover 104 above the substrate 102 and the semiconductor device 106 residing in the package. The height of standoffs 109 is selected such that a gap exists between the bottom surface 132 of cover 104 and the back side surface 107 of semiconductor device 106. A compliant heat transfer medium 112 is positioned between the semiconductor device 106 and cover 104 to thermally couple the back side surface 107 of device 106 to the bottom surface 132 of cover 104. In one embodiment, heat transfer medium 112 comprises a thermal grease, such as a silver filled epoxy.

The thickness of the compliant heat transfer medium will vary depending upon the performance requirements of the semiconductor device being cooled. Generally, the thickness of medium 112 varies between 2 to 10 mils. A cavity 120 comprising a heat pipe is provided within cover 104. Cavity 120 is defined by an upper wall 122, a lower wall 124 and side walls 125 and resides between the external top surface 130 and external bottom surface 132 of the cover. A two-phase vaporizable liquid (not shown) resides within the cavity and serves as the working fluid for the heat pipe. A wick 126 in the form of a mesh is disposed within cavity 120 to facilitate the flow of the working fluid between the upper and lower walls of the cavity.

Figure 1B:
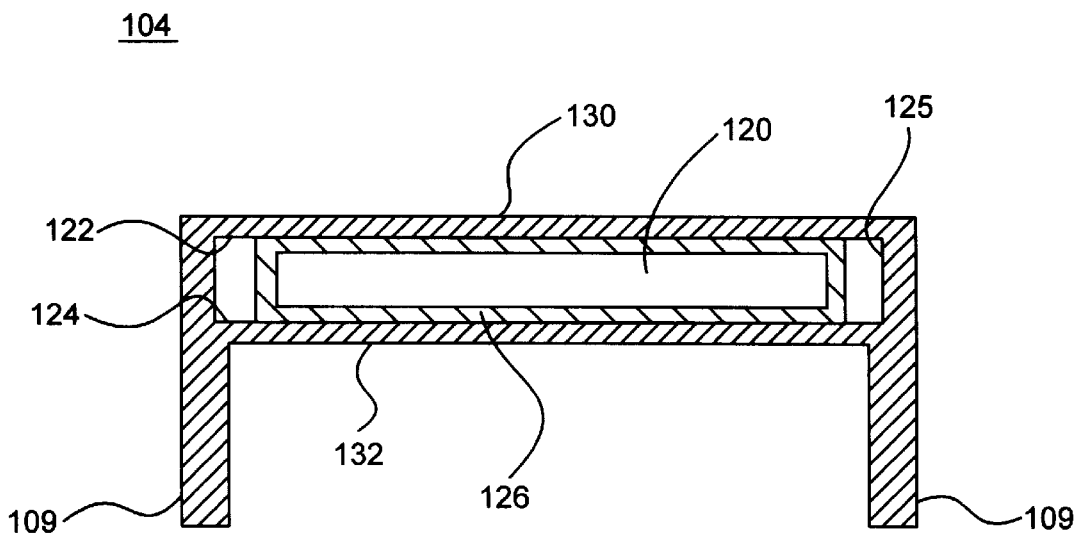
FIG. 1B is a cross-sectional view of the heat pipe cover shown in FIG. 1A.

FIG. 1B is a cross-sectional view of the heat pipe cover 104 of FIG. 1A. The evaporator region of the heat pipe is located adjacent to lower wall 124, whereas the condenser region of the heat pipe is located adjacent upper wall 122. In the evaporator region the working fluid is vaporized by input heat from the semiconductor device, while in the condenser region the vapor gives up heat and is condensed to liquid. The wick 126, by means of capillary flow, transports the condensed liquid back to the evaporator region of the heat pipe.

Figure 1C:
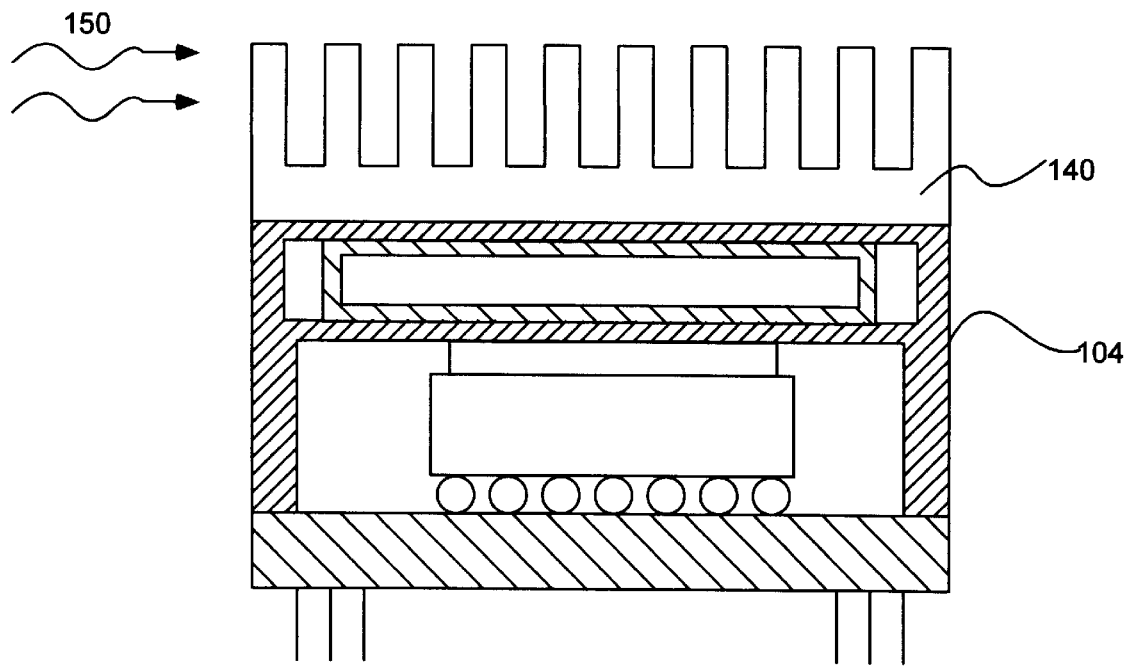
FIG. 1C illustrates the semiconductor package of FIG. 1A having a heat sink attached to the top surface of the heat pipe cover.

The heat pipe cover of the present invention thus provides package 100 with an enhanced ability to spread the heat generated by semiconductor device 106 from the small back side surface area of the device to the much larger top surface area of cover 104. As a result of the heat pipe's superior heat transfer capability, a substantially uniform and lower heat flux is produced along the top surface 130 of cover 104. The lower heat flux makes it much easier to manage the transfer of heat away from the package. As such, conventional heat sinks may be attached to the top surface of the cover to carry heat away from the packaged semiconductor device 106. For example, in one embodiment a finned heat sink 140 is attached to the top surface of cover 104. (See FIG. 1C.) Heat may be removed from the heat sink by passing an air flow over the heat sink.

In one embodiment, heat pipe cover 104 is made of copper. In such an embodiment, purified water is generally chosen as the heat pipe working fluid since it is chemically compatible with copper and possesses a high latent heat. Wick 126 typically comprises copper, stainless steel or a nickel-based metal. The cover cavity 120 may be integrally molded within cover 104 or may be created by the attachment of two separate plates that are hermetically sealed at their joining interface. Heat pipe cover 104 may be made of other high thermally conductive materials, such as aluminum. Since water is chemically reactive with aluminum at elevated temperatures, a freon or freon substitute is used as the heat pipe cover working medium.

Figure 2:
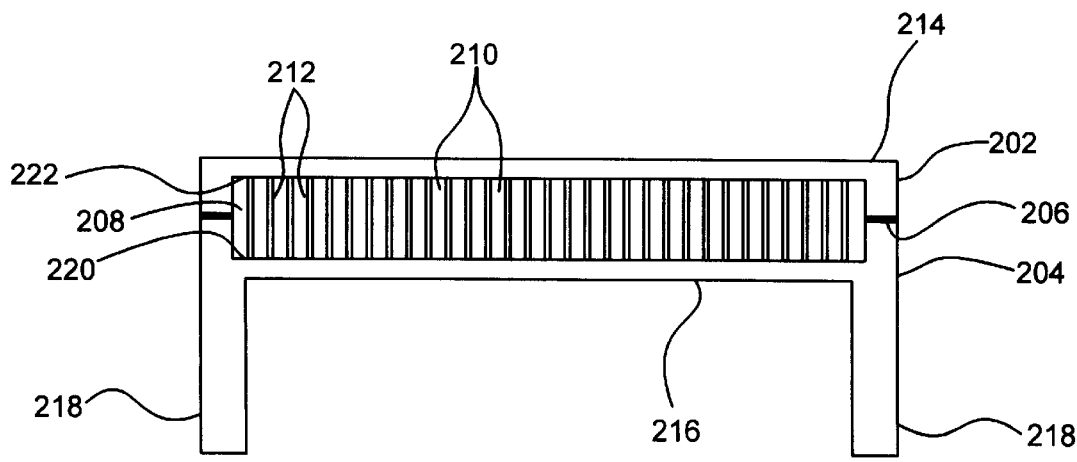
FIG. 2 illustrates a heat pipe cover in accordance with one embodiment of the present invention.

The internal structure of the cover heat pipe may vary considerably from one design to another. It is to be understood, however, that the present invention is not limited to any one heat pipe configuration. For example, in one embodiment the heat pipe may comprise a plurality of micro-channels 210 that are located between the upper wall 222 and lower wall 220 of a heat pipe cover cavity 208 as depicted in FIG. 2. Each of channels 210 includes side walls 212 that contain small grooves (not shown) extending along the length of the wall from the condenser region located adjacent upper wall 222 to the evaporator region located adjacent lower wall 220. The side wall grooves provide the wicking action necessary to transport the condensed liquid from the condenser region to the evaporator region. In one embodiment, channel side walls 212 may contain a wire mesh in lieu of grooves. As illustrated in FIG. 2, cover 200 includes a top portion 202 and a bottom portion 204 that are attached to form cavity 208. Generally, a welded seal 206 is used to attach the two portions. The cover standoffs 218 may be formed integrally with bottom portion 204 or may include a separate structure that is attached to bottom portion 204.

Figure 3:
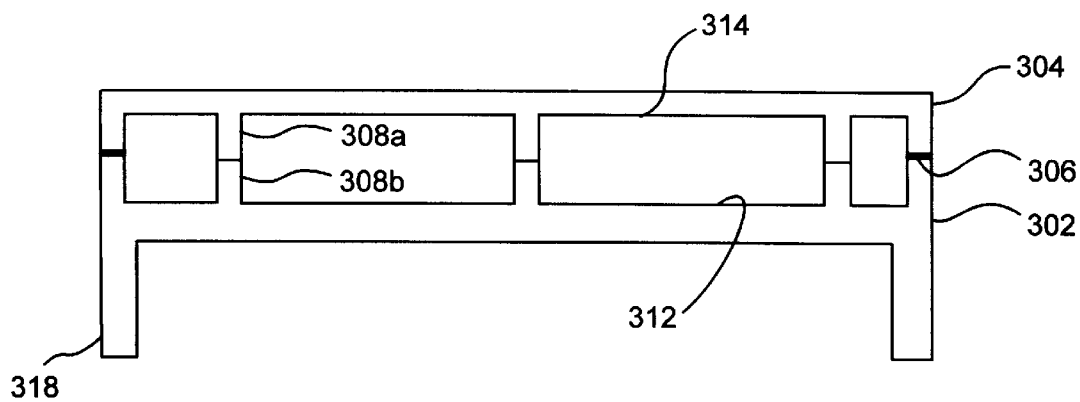
FIG. 3 illustrates a heat pipe cover in another embodiment of the present invention.

Generally, the internal pressure of the cover cavity is maintained below atmospheric pressure. The pressure difference between the cavity and the cover's external surroundings causes a force to act upon the cover surfaces. In order to prevent bowing of the cavity walls, internal support structures may be included within the heat pipe cover to provide structural support to the apparatus. Turning to FIG. 3, a heat pipe cover 300 containing internal support structures is shown. In one embodiment, heat pipe cover 300 consists of two separate portions: an upper portion 304 and a lower portion 302 that are joined by a weld 306. It is appreciated that the present invention is not limited to the particular method in which upper and lower portions 304 and 302 are attached. A plurality of posts 308a and 308b protrude from internal surfaces 314 and 312 of upper and lower portions 304 and 302, respectively. Posts 308a and 308b may be integrally formed or separately attached to upper and lower portions 304 and 302, respectively. In one embodiment upper and lower portions 304 and 302 are stamped. In yet another embodiment upper and lower portions 304 and 302 are molded. Standoffs 308a and 308b may be substituted with a single unitary standoff that protrudes from either surface 312 or surface 314. Besides providing mechanical support, such posts can also be used as surfaces to attach wicks, like powders, wire mesh, to provide a continuous path for liquid to transfer or flow between the surfaces 312 and 314. Alternatively, heat pipe cover 300 may be unitarily manufactured by an extrusion molding process.

Figure 4:
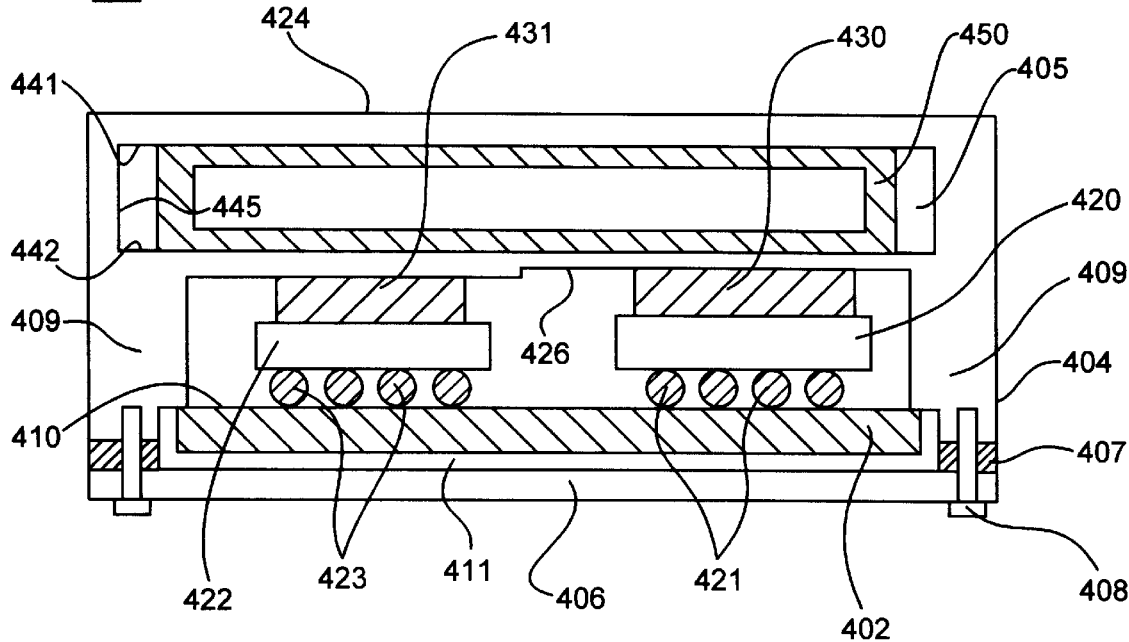
FIG. 4 illustrates a multi-chip module in accordance with one embodiment of the present invention.

FIG. 4 illustrates a cross-sectional view of a multi-chip module 400 in accordance with one embodiment of the present invention. FIG. 4 shows two semiconductor devices 420 and 422 mounted onto the top surface 410 of a substrate 402. It is appreciated that the multi-chip module of the present invention is not limited to two semiconductor devices. In one embodiment, semiconductor devices 420 and 422 are mechanically and electrically coupled to substrate 402 via a plurality of solder bump connections 421 and 423, respectively. Substrate 402 contains at least one wiring layer (not shown) that electrically connects semiconductor devices 420 and 422 to pads or pins (not shown) located along the bottom surface 411 of substrate 402. In accordance with the present invention, a heat pipe cover/lid 404 is attached to a baseplate 406 to create a space therebetween for accommodating semiconductor devices 420 and 422 and substrate 402. Fasteners 408 are used to attach heat pipe cover 404 to baseplate 406. A gasket 407 may be positioned between the heat pipe cover and baseplate interface to provide an air tight seal at the interface. Gasket 407 may also provide an EMI shield or seal for the Module assembly. Standoffs 409 serve to support heat pipe cover 404 above semiconductor devices 420 and 422. The height of standoffs 409 is selected such that a gap exists between the bottom surface 426 of cover 404 and the backside surfaces of semiconductor devices 420 and 422. The bottom surface 426 of heat pipe cover 404 may have a stepped configuration to accommodate the height difference between the semiconductor devices housed within the multi-chip module. A compliant heat transfer medium 430 and 431 is positioned between the bottom surface 426 of cover 404 and the backside surfaces of devices 420 and 422, respectively. In one embodiment, heat transfer media 430 and 431 comprise a thermal grease. The thickness of the heat transfer media will vary depending upon the performance requirements of the semiconductor devices being cooled.

A cavity 405 comprising a heat pipe is provided within cover 404. Cavity 405 is defined by an upper wall 441, a lower wall 442, and side walls 445 and resides between the external top surface 424 and bottom surface 426 of cover 404. A two-phase vaporizable liquid (not shown) resides within the cavity and serves as the working fluid for the heat pipe. In one embodiment, a wick 450 in the form of a mesh is disposed within cavity 405 to facilitate the flow of the working fluid between the upper and lower walls of the cavity. It is to be understood that the internal structure of the cover heat pipe may vary. For example, the use of grooved micro-channels or other wicking means may be used to transport the working medium within cavity 405 without deviating from the spirit and scope of the present invention. Heat pipe cover 404 may also include internal support structures to inhibit bowing of the cover when a vacuum is established within cavity 405.

Figure 5:
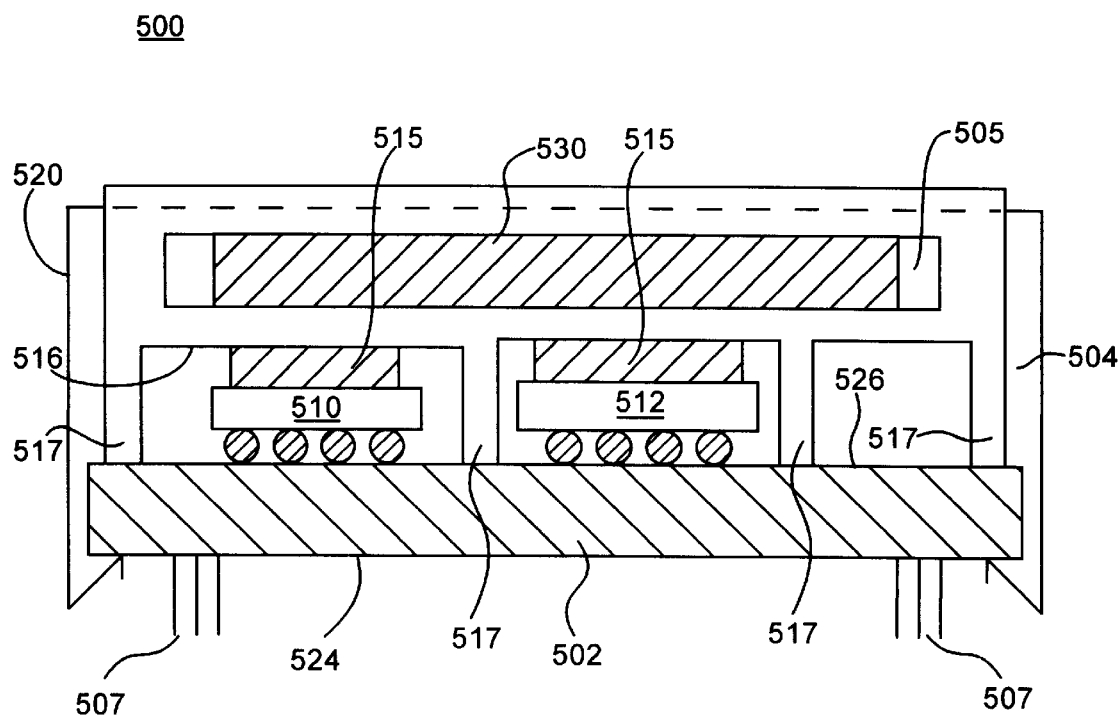
FIG. 5 illustrates a multi-chip module in accordance with another embodiment of the present invention.

With reference to FIG. 5, a multi-chip module 500 in accordance with another embodiment of the present invention is shown. Module 500 contains two semiconductor devices 510 and 512 that are mechanically and electrically coupled to the top surface 526 of a substrate 502 via a plurality of solder bump interconnections. Substrate 502 contains at least one wiring layer (not shown) that electrically connects devices 510 and 512 to pins 507 located along the bottom surface 524 of substrate 502. Module 500 includes a heat pipe cover 504 having a plurality of standoffs 517 that support the cover above substrate 502. A cavity 505 comprising a heat pipe is provided within cover 504 to facilitate the transfer of heat away from devices 510 and 512 to the top surface 530 of cover 504. A thermal grease 515, or other compliant thermally conductive material, serves as the thermal interface between the backside of semiconductor devices 510 and 512 and the bottom surfaces 516 of cover 504. In one embodiment, heat pipe cover 504 is secured to substrate 502 by a spring clip 520.

Thus, what has been described is an apparatus for removing heat from the backside of a packaged semiconductor device. In the foregoing detailed description, the apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A semiconductor package comprising:
   a substrate having a top surface;
   at least one semiconductor device attached to said top surface of said substrate; and
   a cover secured to said substrate creating a space therebetween, said semiconductor device residing within said space, said cover having a flat top surface and an external bottom surface and an inner cavity comprising a heat pipe, said semiconductor device thermally coupled to said external bottom surface.

2. The semiconductor package of claim 1 wherein said cavity is defined by an upper wall, a lower wall and side walls, said cavity containing a two-phase vaporizable liquid and a wick to facilitate the transfer of said liquid between a condenser region adjacent said upper wall and an evaporator region adjacent said lower wall.

3. The semiconductor package of claim 2 wherein said wick comprises a metal mesh.

4. The semiconductor package of claim 2 wherein said wick comprises a plurality of substantially parallel channels extending between said upper wall and said lower wall, each of said channels having side walls, said side walls having grooves formed therein to facilitate the transfer of said liquid from said condenser region to said evaporator region.

5. The semiconductor package of claim 2 wherein said wick comprises a plurality of substantially parallel channels extending between said upper wall and said lower wall, each of said channels having side walls, said side walls having a wire mesh attached thereto to facilitate the transfer of said liquid from said condenser region to said evaporator region.

6. The semiconductor package of claim 1 further comprising a plurality of posts disposed between said upper wall and said lower wall to provide support to said cover.

7. The semiconductor package of claim 1 wherein said cover comprises a top portion and a bottom portion, said top and bottom portions being joined and sealed to create said cavity.

8. The semiconductor package of claim 1 further comprising a heat sink that is attached to said flat top surface of said cover.

9. The semiconductor package of claim 2 wherein said cover is made of copper.

10. The semiconductor package of claim 2 wherein said cover is made of aluminum.

11. The semiconductor package of claim 9 wherein said liquid comprises water.

12. The semiconductor package of claim 10 wherein said liquid is selected from the group consisting of: freon and freon substitutes.

13. The semiconductor package of claim 1 wherein cover is flexibly secured to said substrate by a spring clip.

14. A semiconductor package comprising:
   a substrate having a top surface;
   at least one semiconductor device attached to said top surface of said substrate;
   a cover secured to said substrate creating a space therebetween, said semiconductor device residing within said space, said cover having a flat top surface and a bottom surface and an inner cavity defined by an upper wall, a lower wall and side walls, said cavity comprising a heat pipe having a condenser region and an evaporator region, said condenser region located adjacent said upper wall and said evaporator region located adjacent said lower wall;
   a two-phase vaporizable liquid present in said cavity; and
   a wick disposed within said cavity to facilitate the flow of said liquid between said condenser region and said evaporator region.

15. The semiconductor package of claim 14 wherein said wick comprises a metal mesh.

16. The semiconductor package of claim 14 wherein said wick comprises a plurality of substantially parallel channels extending between said upper wall and said lower wall, each of said channels having side walls, said side walls having grooves formed therein to facilitate the transfer of said liquid from said condenser region to said evaporator region.

17. The semiconductor package of claim 14 wherein said wick comprises a plurality of substantially parallel channels extending between said upper wall and said lower wall, each of said channels having side walls, said side walls having a wire mesh attached thereto to facilitate the transfer of said liquid from said condenser region to said evaporator region.

18. The semiconductor package of claim 14 further comprising a plurality of posts disposed between said upper wall and said lower wall to provide support to said cover.

19. The semiconductor package of claim 14 wherein said cover comprises a top portion and a bottom portion, said top and bottom portions being joined and sealed to create said cavity.

20. The semiconductor package of claim 14 further comprising a heat sink that is attached to said flat top surface of said cover.

21. The semiconductor package of claim 14 wherein said cover is made of copper.

22. The semiconductor package of claim 14 wherein said cover is made of aluminum.

23. The semiconductor package of claim 21 wherein said liquid comprises water.

24. The semiconductor package of claim 22 wherein said liquid is selected from the group consisting of: freon and freon substitutes.

25. The semiconductor package of claim 14 wherein cover is secured to said substrate by a spring clip.

26. A semiconductor package comprising:
a package substrate having a top surface and a bottom surface;
at least one semiconductor device having a top-side surface and a backside surface, said top-side surface of said semiconductor device attached to said top surface of said substrate via a plurality of solder bump interconnections;
a cover secured to said substrate creating a space therebetween, said semiconductor device residing within said space, said cover having a top surface and a bottom surface and an inner cavity defined by an upper wall, a lower wall and side walls, said cavity comprising a heat pipe having a condenser region and an evaporator region, said condenser region located adjacent said upper wall and said evaporator region located adjacent said lower wall;
at least one post positioned between said upper wall and said lower wall of said cavity to provide support to said cover;
a two-phase vaporizable liquid present in said cavity;
a wick disposed within said cavity to facilitate the flow of said liquid between said condenser region and said evaporator region; and
a heat sink thermally coupled to said external top surface of said cover.

27. The semiconductor package of claim 26 wherein said wick comprises a metal mesh.

28. The semiconductor package of claim 26 wherein said wick comprises a plurality of substantially parallel channels extending between said upper wall and said lower wall, each of said channels having side walls, said side walls having grooves formed therein to facilitate the transfer of said liquid from said condenser region to said evaporator region.

29. The semiconductor package of claim 26 wherein said wick comprises a plurality of substantially parallel channels extending between said upper wall and said lower wall, each of said channels having side walls, said side walls having a wire mesh attached thereto to facilitate the transfer of said liquid from said condenser region to said evaporator region.

30. The semiconductor package of claim 26 wherein said cover is made of copper.

31. The semiconductor package of claim 26 wherein said cover is made of aluminum.

32. The semiconductor package of claim 30 wherein said liquid comprises water.

33. The semiconductor package of claim 31 wherein said liquid is selected from the group consisting of: freon and freon substitutes.

34. The semiconductor package of claim 26 wherein said cover is flexibly secured to said substrate by a spring clip.

35. A semiconductor package comprising:
a substrate having a top surface;
at least one semiconductor device attached to said top surface of said substrate;
a cover secured to said substrate creating a space therebetween, said semiconductor device residing within said space, said cover having a top surface and a bottom surface and an inner cavity defined by an upper wall, a lower wall and side walls, said cavity comprising a heat pipe having a condenser region and an evaporator region, said condenser region located adjacent said upper wall and said evaporator region located adjacent said lower wall;
a two-phase vaporizable liquid present in said cavity; and
a wick disposed within said cavity to facilitate the flow of said liquid between said condenser region and said evaporator region, said wick comprising a plurality of substantially parallel channels extending between said upper wall and said lower wall, each of said channels having side walls, said side walls having grooves formed therein to facilitate the transfer of said liquid from said condenser region to said evaporator region.

36. A semiconductor package comprising:
a substrate having a top surface;
at least one semiconductor device attached to said top surface of said substrate;
a cover secured to said substrate creating a space therebetween, said semiconductor device residing within said space, said cover having a top surface and a bottom surface and an inner cavity defined by an upper wall, a lower wall and side walls, said cavity comprising a heat pipe having a condenser region and an evaporator region, said condenser region located adjacent said upper wall and said evaporator region located adjacent said lower wall;
a two-phase vaporizable liquid present in said cavity; and
a wick disposed within said cavity to facilitate the flow of said liquid between said condenser region and said evaporator region, said wick comprising a plurality of substantially parallel channels extending between said upper wall and said lower wall, each of said channels having side walls, said side walls having a wire mesh attached thereto to facilitate the transfer of said liquid from said condenser region to said evaporator region.

37. A semiconductor package comprising:
a package substrate having a top surface and a bottom surface;
at least one semiconductor device having a top-side surface and a backside surface, said top-side surface of said semiconductor device attached to said top surface of said substrate via a plurality of solder bump interconnections;
a cover secured to said substrate creating a space therebetween, said semiconductor device residing within said space, said cover having a top surface and a bottom surface and an inner cavity defined by an upper wall, a lower wall and side walls, said cavity comprising a heat pipe having a condenser region and an evaporator region, said condenser region located adjacent said upper wall and said evaporator region located adjacent said lower wall;
at least one post positioned between said upper wall and said lower wall of said cavity to provide support to said cover;

a two-phase vaporizable liquid present in said cavity;

a wick disposed within said cavity to facilitate the flow of said liquid between said condenser region and said evaporator region, said wick comprising a plurality of substantially parallel channels extending between said upper wall and said lower wall, each of said channels having side walls, said side walls having grooves formed therein to facilitate the transfer of said liquid from said condenser region to said evaporator region; and a heat sink thermally coupled to said external top surface of said cover.

38. A semiconductor package comprising:

a package substrate having a top surface and a bottom surface;

at least one semiconductor device having a top-side surface and a backside surface, said top-side surface of said semiconductor device attached to said top surface of said substrate via a plurality of solder bump interconnections;

a cover secured to said substrate creating a space therebetween, said semiconductor device residing within said space, said cover having a top surface and a bottom surface and an inner cavity defined by an upper wall, a lower wall and side walls, said cavity comprising a heat pipe having a condenser region and an evaporator region, said condenser region located adjacent said upper wall and said evaporator region located adjacent said lower wall;

at least one post positioned between said upper wall and said lower wall of said cavity to provide support to said cover;

a two-phase vaporizable liquid present in said cavity;

a wick disposed within said cavity to facilitate the flow of said liquid between said condenser region and said evaporator region, said wick comprising a plurality of substantially parallel channels extending between said upper wall and said lower wall, each of said channels having side walls, said side walls having a wire mesh attached thereto to facilitate the transfer of said liquid from said condenser region to said evaporator region; and a heat sink thermally coupled to said external top surface of said cover.

* * * * *